(12) United States Patent
Dosho et al.

(10) Patent No.: US 6,407,642 B2
(45) Date of Patent: Jun. 18, 2002

(54) FREQUENCY DETECTOR AND PHASE-LOCKED LOOP CIRCUIT INCLUDING THE DETECTOR

(75) Inventors: Shiro Dosho; Naoshi Yanagisawa; Masaomi Toyama, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/752,525

(22) Filed: Jan. 3, 2001

(30) Foreign Application Priority Data

Jan. 7, 2000 (JP) .......................... 2000-005873

(51) Int. Cl.[7] .................. H03L 7/085; H03L 7/087
(52) U.S. Cl. .................. 331/11; 331/1 A; 331/17; 331/25; 327/40; 327/42; 327/43; 327/156; 327/157; 327/159
(58) Field of Search .................. 331/1 A, 11, 17, 331/18, 25, DIG. 2; 327/40–43, 156–159; 360/51; 375/376; 455/260

(56) References Cited

U.S. PATENT DOCUMENTS 5,079,519 A * 1/1992 Ashby et al. ............... 331/1 A
5,233,314 A * 8/1993 McDermott et al. ........... 331/17
5,302,916 A * 4/1994 Pritchett ..................... 331/1 A

OTHER PUBLICATIONS

"Phase–Locked Loop Circuit Design", Dan H. Wolaver, Section 4–12, Prentice Hall (1991), pp. 68–75.

* cited by examiner

*Primary Examiner*—David Mis
(74) *Attorney, Agent, or Firm*—McDermott, Will & Emery

(57) ABSTRACT

A three-state phase detector, including two latches and one NAND gate, is provided with two additional latches. To detect a phase difference between first and second input clock signals R and V, the phase detector alternates among three states responsive to a rising edge of the input R or V signal. Each of the two additional latches and an associated latch in the phase detector together constitute one shift register. When the phase detector gets back to its neutral state, the NAND gate generates a reset signal, thereby resetting all of these four latches. Two isolated pulse generators are further provided. Each of the pulse generators makes the pulse width of a frequency difference pulse signal, output from associated one of the additional latches, constant and then outputs the pulse signal with the constant width.

4 Claims, 5 Drawing Sheets

FREQUENCY DETECTOR AND PHASE-LOCKED LOOP CIRCUIT INCLUDING THE DETECTOR

BACKGROUND OF THE INVENTION

The present invention relates to a frequency detector and a phase-locked loop (PLL) circuit that can detect a frequency difference using the detector built in the circuit.

A PLL circuit is an important circuit applicable to various types of LSI systems of today. A known PLL circuit includes a PLL and a frequency controller. The PLL is made up of phase detector, charge pump, low-pass filter (LPF), voltage-controlled oscillator (VCO) and frequency divider. The frequency controller is provided to eliminate a frequency deviation from the PLL. In the PLL, if the gain of the VCO is decreased to enhance the noise immunity of the PLL, then the output frequency range of the VCO shrinks correspondingly, thus narrowing the frequency locking range of the PLL unintentionally. To avoid this problem, the PLL circuit is equipped with not only the phase detector that compares the phases of reference and oscillated clock signals to each other but also the frequency controller including a frequency detector that detects a frequency difference between these clock signals. That is to say, the PLL circuit utilizes two feedback loops so as not to narrow the frequency locking range. Specifically, in this case, the additional feedback loop, formed by the frequency detector, should have an increased gain, while the original phase-locked loop should have a decreased gain.

An exemplary known frequency detector was disclosed by D. S H. Wolaver in "Phase-Locked Loop Circuit Design", Section 4-12, pp. 68–75, Prentice Hall (1991). The Wolaver's frequency detector includes a three-state phase detector and first and second additional detectors called "slip detectors". Responsive to a rising edge of a first or second input clock signal, the phase detector alternates among three states, thereby outputting first and second phase difference pulse signals. Each of the pulse signals represents a phase difference between the two input clock signals. The first slip detector includes two cascaded latches, receiving the first phase difference pulse signal at its clock input, and a device for delaying the first input clock signal. The second slip detector includes two cascaded latches, receiving the second phase difference pulse signal at its clock input, and a device for delaying the second input clock signal.

The known frequency detector uses the phase difference pulse signals of the phase detector as clock signals for activating the initial-stage latches of the slip detectors. Accordingly, if the pulse width of the phase difference pulse signals is too narrow to set the initial-stage latches of the slip detectors, then the frequency difference will be detected erroneously.

In addition, each of the delay devices for the slip detectors needs a large number of inverters. Accordingly, these inverters might generate noise and adversely affect the operation of the PLL circuit. Furthermore, the delay should be controlled so strictly that the operating range of the PLL circuit might be limited.

SUMMARY OF THE INVENTION

It is therefore an object of the present invention to provide a frequency detector that is implementable using a much simpler circuit configuration and yet needs no such strict delay control.

Another object of the present invention is to provide a phase-locked loop circuit that can detect a frequency difference by using the frequency detector built in it.

To achieve these objects, a frequency detector according to the present invention is realized just by connecting first and second latches to a three-state phase detector of the known type.

Specifically, in the present invention, the three-state phase detector includes first and second input terminals and first and second output terminals. To detect a phase difference between first and second input clock signals presented to the first and second input terminals, respectively, the phase detector outputs first and second phase difference pulse signals through the first and second output terminals, respectively, by alternating among the following three states. If an effective edge of the first input clock signal is presented to the phase detector in a neutral state, then the phase detector is set to change into a first phase detection state. If an effective edge of the second input clock signal is presented to the phase detector in the neutral state, then the phase detector is set to change into a second phase detection state. And if effective edges of the first and second input clock signals are presented to the phase detector in this order or vice versa, then a reset signal is generated and the phase detector is reset and get back to the neutral state responsive to the reset signal. The first latch latches the signal, which has been output through the first output terminal of the phase detector, responsive to an effective edge of the first input clock signal, and is reset responsive to the reset signal of the phase detector. The first latch outputs a first frequency difference pulse signal if two edges of the first input clock signal have been presented to the phase detector consecutively with no effective edges of the second input clock signal presented between the two edges. The second latch latches the signal, which has been output through the second output terminal of the phase detector, responsive to an effective edge of the second input clock signal, and is reset responsive to the reset signal of the phase detector. The second latch outputs a second frequency difference pulse signal if two edges of the second input clock signal have been presented to the phase detector consecutively with no effective edges of the first input clock signal presented between the two edges.

According to the present invention, a frequency detector is implementable just by connecting two latches to a three-state phase detector of the known type. Thus, the inventive frequency detector can be of a much smaller circuit size than the known ones. In addition, according to the present invention, the phase difference pulse signals output from the three-state phase detector are not used as clock signals that activate the first-stage latches of slip detectors unlike the known frequency detector. Instead, in the present invention, the input clock signals for the phase detector are also used as clock signals for activating the two additional latches. Thus, the inventive frequency detector can have its operation stabilized even without controlling delays, for example. That is to say, the inventive frequency detector can advantageously be designed much more easily, and still can operate much more stably, than the known frequency detector

DETAILED DESCRIPTION OF INVENTION

Hereinafter, preferred embodiments of the present invention will be described with reference to the accompanying drawings.

Figure 1:
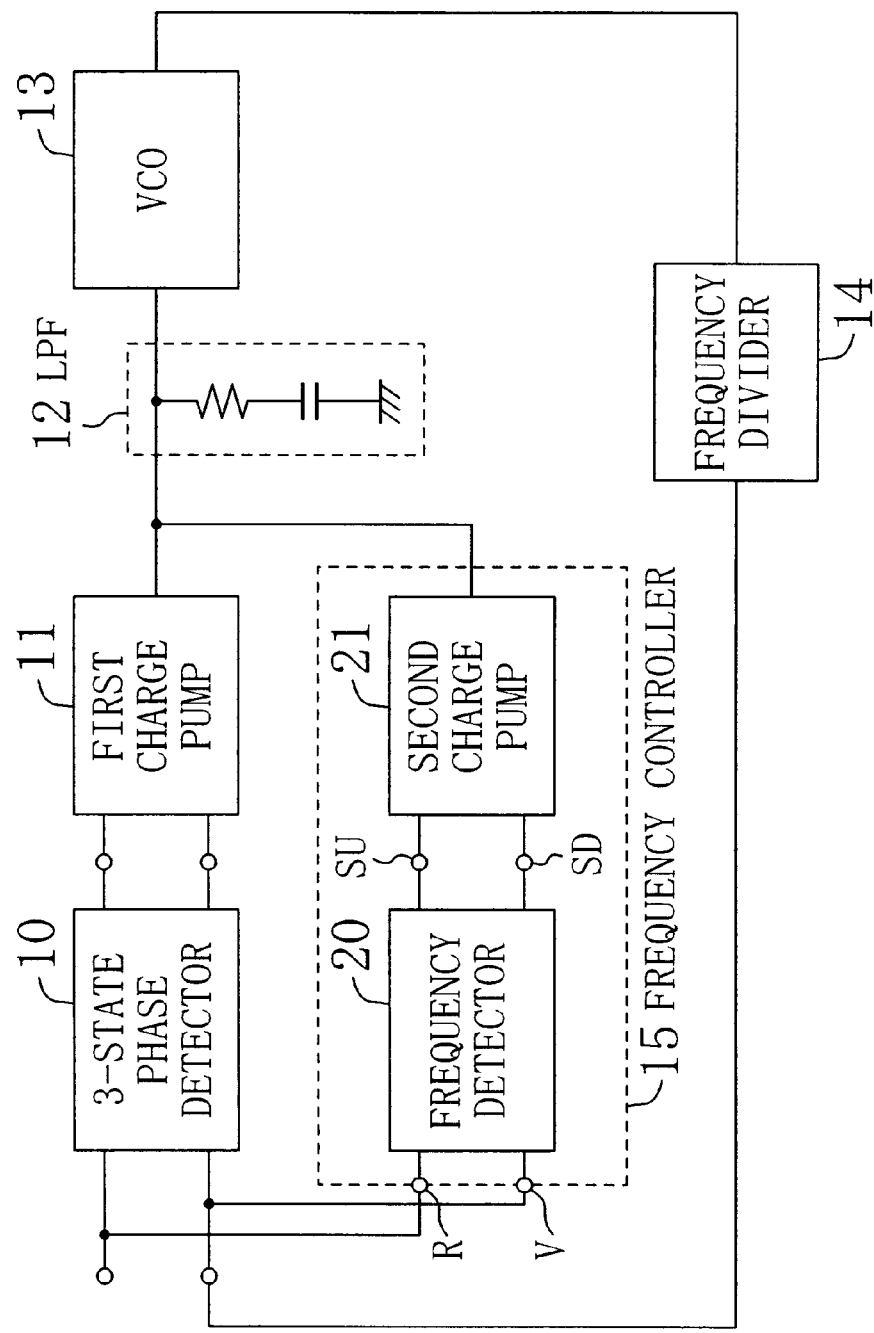
FIG. 1 is a block diagram illustrating an exemplary configuration for a PLL circuit according to the present invention.

FIG. 1 illustrates an exemplary configuration for a PLL circuit according to the present invention. As illustrated in FIG. 1, the PLL circuit includes three-state phase detector 10, first charge pump 11, LPF 12, VCO 13 and frequency divider 14, all of which together constitutes a PLL. The PLL circuit shown in FIG. 1 further includes a frequency controller 15 for eliminating a frequency deviation from the PLL. That is to say, the PLL circuit has frequency difference detection capabilities. The frequency controller 15 includes a frequency detector 20 and a second charge pump 21. The frequency detector 20 receives a reference clock signal for the PLL and an oscillated clock signal, which has already had its frequency divided, as first and second input clock signals R and V, respectively. The second charge pump 21 receives the outputs of the frequency detector 20 through two terminals SU and SD and controls the oscillation frequency of the PLL responsive to these outputs.

Figure 2:
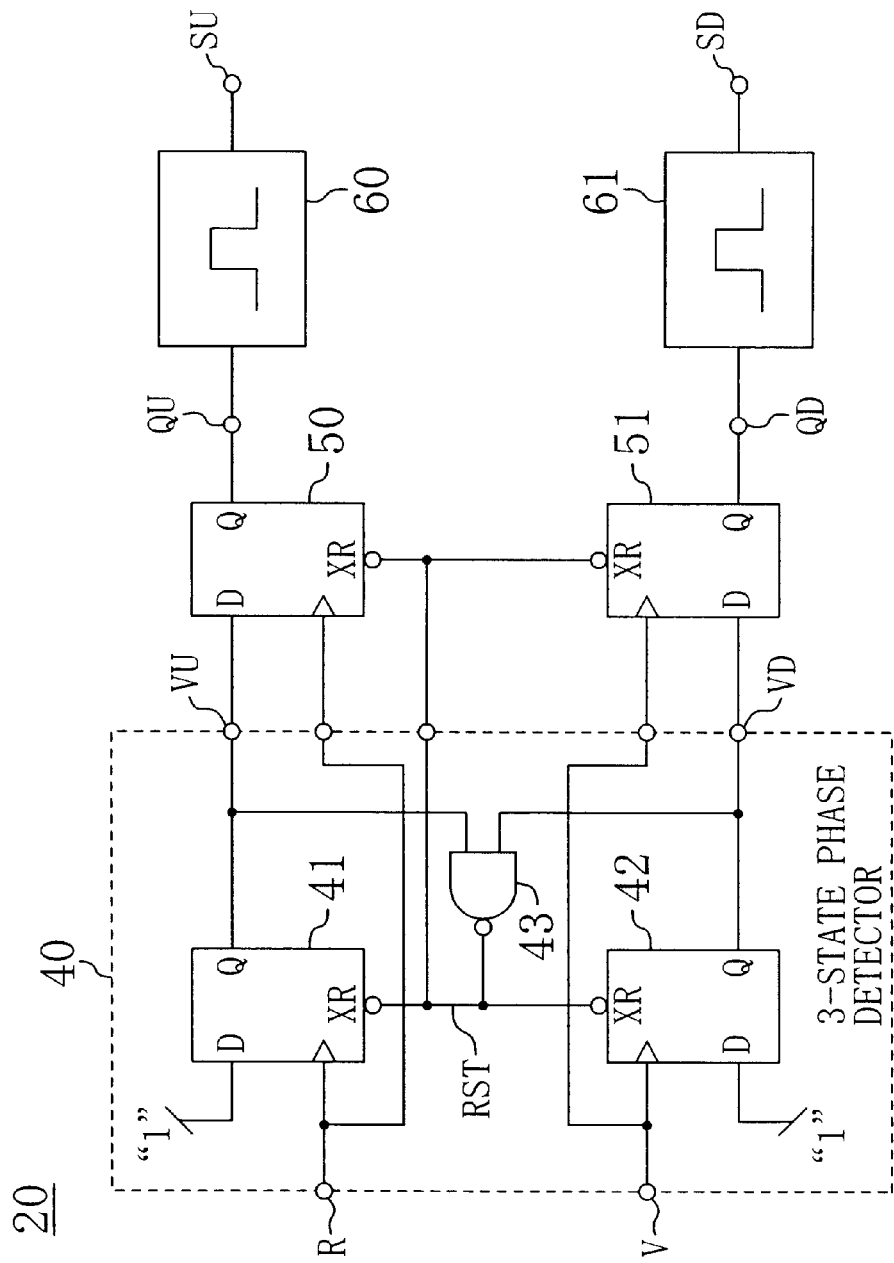
FIG. 2 is a block diagram illustrating a detailed configuration for the frequency detector shown in FIG. 1.

FIG. 2 illustrates a detailed configuration for the frequency detector 20 shown in FIG. 1. The frequency detector includes a three-state phase detector 40, two latches 50 and 51 and two isolated pulse generators 60 and 61.

As shown in FIG. 2, the three-state phase detector 40 includes first and second input terminals and first and second output terminals. To detect a phase difference between the input R/V signals presented to the first and second input terminals, the phase detector 40 outputs first and second phase difference pulse signals VU and VD through the first and second output terminals, respectively, by alternating among the following three states. If a rising edge of the input R signal is presented to the phase detector 40 in a neutral state, then the detector 40 is set to change into a first phase detection state. If a rising edge of the input V signal is presented to the phase detector 40 in the neutral state, then the detector 40 is set to change into a second phase detection state. And if rising edges of the input R/V signals are presented to the phase detector 40 in this order or vice versa, then a reset signal RST is generated and the detector 40 is reset and get back to the neutral state responsive to the RST signal. As shown in FIG. 2, the phase detector 40 includes two latches 41 and 42 and one NAND gate 43.

The latch 50 latches the VU signal responsive to a rising edge of the input R signal, and is reset responsive to the RST signal so as to output a first frequency difference pulse signal QU if two edges of the input R signal have been presented consecutively with no rising edges of the input V signal presented between those edges. That is to say, this latch 50 and the latch 41 in the phase detector 40 together constitute one shift register. The isolated pulse generator 60 is a circuit for making the pulse width of the QU signal constant and then outputting the QU signal with the constant width to the SU terminal. For example, the pulse generator 60 may be a monostable multivibrator.

The latch 51 latches the VD signal responsive to a rising edge of the input V signal, and is reset responsive to the RST signal so as to output a second frequency difference pulse signal QD if two edges of the input V signal have been presented consecutively with no rising edges of the input R signal presented between those edges. That is to say, this latch 51 and the latch 42 in the phase detector 40 together constitute one shift register. The isolated pulse generator 61 is a circuit for making the pulse width of the QD signal constant and then outputting the QD signal with the constant width to the SD terminal. For example, the pulse generator 61 may also be a monostable multivibrator.

Figure 3:
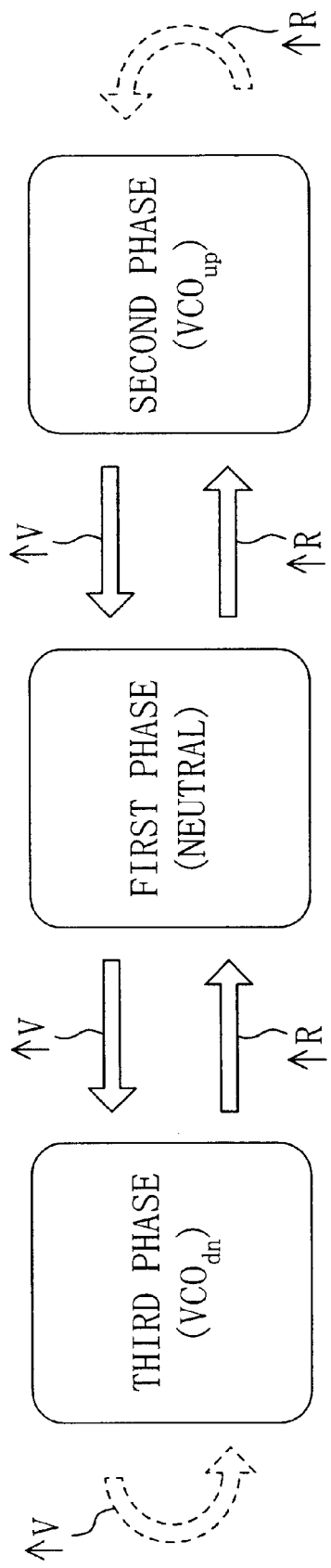
FIG. 3 is a diagram illustrating the state transition of the three-state phase detector shown in FIG. 2.

FIG. 3 illustrates the state transitions of the three-state phase detector 40 shown in FIG. 2. The first, second and third phases shown in FIG. 3 correspond to the neutral, first phase detection and second phase detection states, respectively. That is to say, the frequency detector 20 shown in FIG. 2 detects the state transitions indicated by the broken-line arrows in FIG. 3. As can be seen from FIG. 3, one of those transitions to be detected occurs where two rising edges of the input R signal have been presented consecutively, while the other occurs where two rising edges of the input V signal have been presented consecutively.

That is to say, where the frequencies of the input R/V signals are different from each other, rising edges of one of these R/V signals may be presented twice consecutively while no rising edges of the other are being presented. Then, the frequency detector 20 shown in FIG. 2 outputs a high-level (or H-level) signal in logic "1" state, representing that a frequency difference has been detected, as the QU or QD signal.

On the other hand, where there is no frequency difference between the input R/V signals, rising edges of one of these R/V signals cannot be presented twice consecutively while no rising edges of the other are being presented. In other words, each and every rising edge of the input R signal should be followed by a rising edge of the input V signal. Or once a rising edge of the input V signal has been presented, a rising edge of the input R signal should always appear next. Accordingly, the three-state phase detector 40 never fails to get back to the neutral state within one clock cycle time. And when the detector 40 changes into the neutral state, the NAND gate 43 outputs the RST signal, thereby resetting all of these four latches 41, 42, 50 and 51. Thus, the QU or QD signal in logic "1" state is not output.

As can be seen, the frequency detector 20 shown in FIG. 2 can have a circuit size much smaller than the known one. In 15 addition, since the input clock signals R/V for the three-state phase detector 40 are also used as activating clock signals for the additional latches 50 and 51, the frequency detector 20 can have its operation stabilized without controlling the delays, for example. However, the pulse widths of the QU and QD signals might change greatly depending on the frequencies of the input R/V signals or on a frequency difference between the R/V signals. Thus, in the example illustrated in FIG. 2, the isolated pulse generators 60 and 61 are added to avoid such drastic change of the output pulse widths at the SU/SD terminals. In this manner, the responsiveness of the PLL circuit can be stabilized.

The PLL circuit shown in FIG. 1 has two feedback loops, namely, the phase-locked loop that passes through the three-state phase detector 10 and the first charge pump 11 and a frequency control loop that passes through the frequency detector 20 and the second charge pump 21. Accordingly, the gains of these two loops can be set independently. That is to say, even if the gain of the PLL is decreased, the locking range of the PLL circuit does not decrease correspondingly. Thus, the PLL circuit shown in FIG. 1 can not only have its noise immunity enhanced by reducing the loop gain of the PLL but also have its locking range broadened as well.

Figure 4:
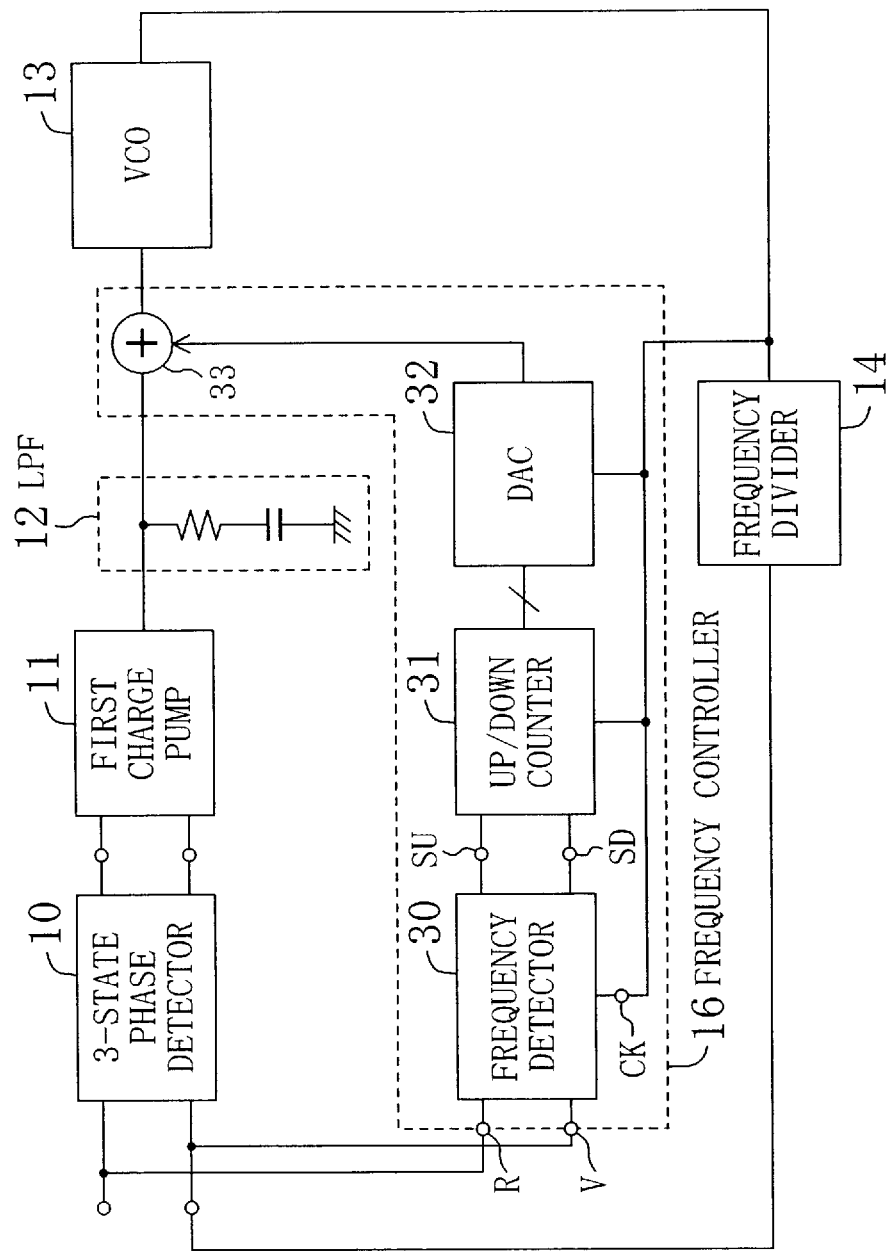
FIG. 4 is a block diagram illustrating an alternative configuration for the PLL circuit of the present invention.

FIG. 4 illustrates an alternative configuration for the PLL circuit of the present invention. In the PLL circuit shown in FIG. 4, the frequency controller 15 shown in FIG. 1 is replaced with a frequency controller 16 with a different configuration. As shown in FIG. 4, the frequency controller 16 includes frequency detector 30, up/down counter 31, digital-to-analog converter (DAC) 32 and adder 33. The frequency detector 30 receives a reference clock signal for the PLL and an oscillated clock signal, which has already had its frequency divided, as the first and second input clock signals R and V, respectively. The up/down counter 31 receives the outputs of the frequency detector 30 through two terminals SU and SD and updates its count responsive to these outputs. The DAC 32 performs an analog control over the oscillation frequency of the PLL in accordance with the count of the up/down counter 31. Also, in the configuration shown in FIG. 4, the oscillated clock signal, which has not had its frequency divided yet, is delivered to the frequency detector 30, up/down counter 31 and DAC 32. In FIG. 4, CK denotes a third clock signal input to the frequency detector 30.

Figure 5:
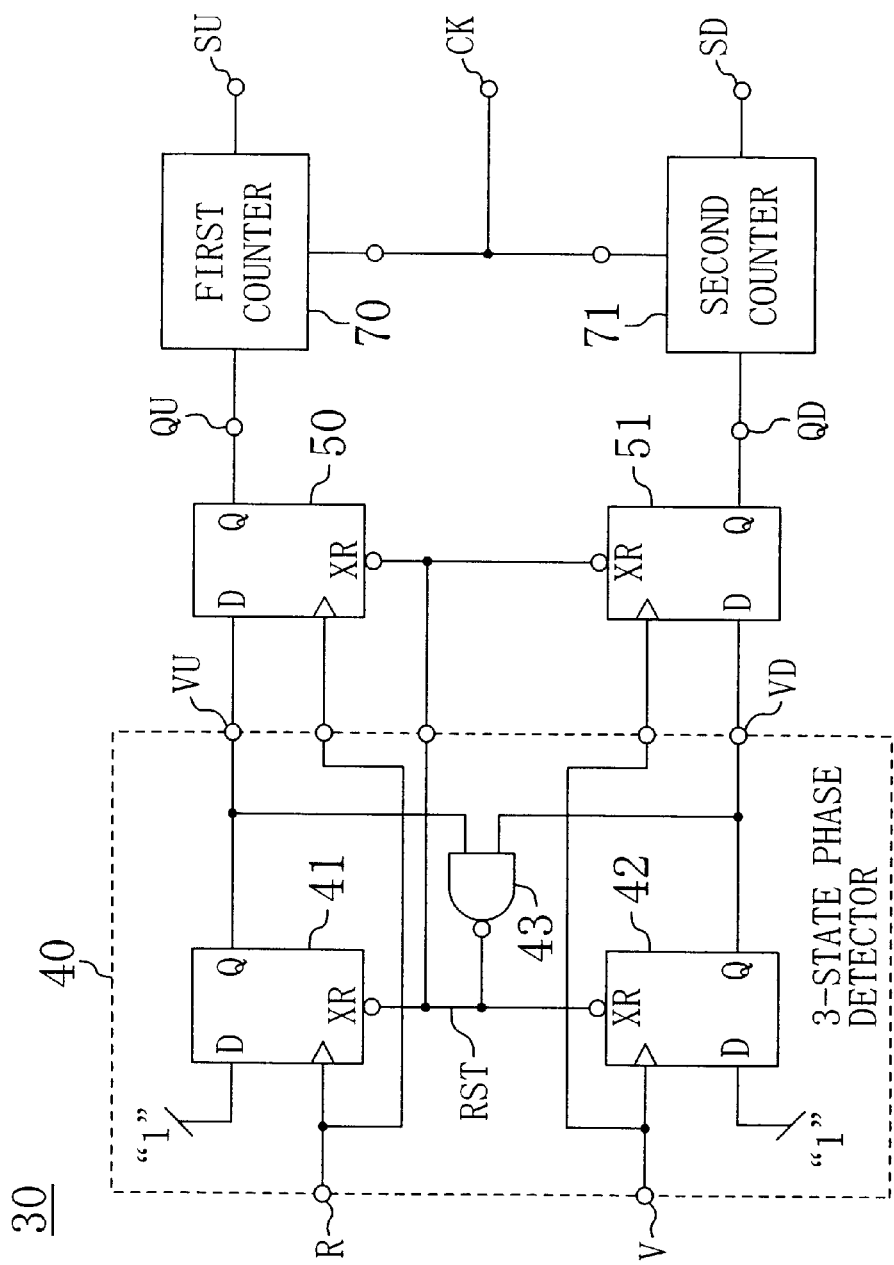
FIG. 5 is a block diagram illustrating a detailed configuration for the frequency detector shown in FIG. 4.

FIG. 5 illustrates a detailed configuration for the frequency detector 30 shown in FIG. 4. In the frequency detector 30 shown in FIG. 5, the isolated pulse generators 60 and 61 shown in FIG. 2 are replaced with first and second counters 70 and 71, respectively. The first counter 70 starts counting the number of pulses of the input CK signal responsive to the output QU signal of the latch 50. And when its count reaches a predetermined number, the counter 70 is reset internally. The second counter 71 starts counting the number of pulses of the input CK signal responsive to the output QD signal of the latch 51. And when its count reaches a predetermined number, the counter 71 is also reset internally. The outputs of these two counters 70 and 71 are delivered to the up/down counter 31 via the SU/SD terminals, respectively.

In the frequency detector 30 shown in FIG. 5, when the latch 50 or 51 detects a frequency difference, the frequency difference pulse signal QU or QD is input as a start pulse to the first or second counter 70 or 71. Thus, on receiving the start pulse QU or QD, the first or second counter 70 or 71 starts counting the number of pulses of the input CK signal. The oscillated clock signal CK (which has not had its frequency divided yet) of the VCO 13 normally has a frequency much higher than that of the input clock signal R or V for the frequency detector 30. Accordingly, the oscillated clock signal CK can afford to be an activating clock signal for the first and second counters 70 and 71. Although any other clock signal may be used as the activating clock signal, it is most convenient to use the oscillated clock signal of the VCO 13 as the activating clock signal. When its count reaches a predetermined number, the first or second counter 70 or 71 resets itself and stops counting. Accordingly, by setting the predetermined count to an arbitrary number, the frequency gain can be adjusted. In this manner, the frequency detector 30 shown in FIG. 5 can be easily connected to a digital circuit on a succeeding stage by digitally clocking (or outputting a count of) the output signal.

As in the example illustrated in FIG. 1, the PLL circuit shown in FIG. 4 also has two feedback loops (i.e., the phase-locked loop and the frequency control loop), the loop gains of which can be set independently. In the configuration shown in FIG. 4, however, the frequency control loop has the frequency detector 30, up/down counter 31 and DAC 32. The digital clock signal, output from the frequency detector 30, either increases or decreases the count of the up/down counter 31, thereby changing the output of the DAC 32 and the oscillation frequency of the VCO 13 eventually. That is to say, the frequency control loop shown in FIG. 4 is controlled digitally. Accordingly, compared to a control loop consisting of analog circuits, the frequency control loop shown in FIG. 4 can enhance the noise immunity of the PLL circuit.

What is claimed is:

1. A frequency detector comprising:

a three-state phase detector including first and second input terminals and first and second output terminals, wherein to detect a phase difference between first and second input clock signals presented to the first and second input terminals, respectively, the phase detector outputs first and second phase difference pulse signals through the first and second output terminals, respectively, by alternating among three states in such a manner that:

if an effective edge of the first input clock signal is presented to the phase detector in a neutral state, then the phase detector is set to change into a first phase detection state, if an effective edge of the second input clock signal is presented to the phase detector in the neutral state, then the phase detector is set to change into a second phase detection state and if effective edges of the first and second input clock signals are presented to the phase detector in this order or vice versa, then a reset signal is generated and the phase detector is reset and set back to the neutral state responsive to the reset signal;

a first latch, which latches the signal, output through the first output terminal, responsive to an effective edge of the first input clock signal, and which is reset responsive to the reset signal, the first latch outputting a first frequency difference pulse signal if two edges of the first input clock signal have been presented to the phase detector consecutively with no effective edges of the second input clock signal presented between the two edges;

a second latch, which latches the signal, output through the second output terminal, responsive to an effective edge of the second input clock signal, and which is reset responsive to the reset signal, the second latch outputting a second frequency difference pulse signal if two edges of the second input clock signal have been presented to the phase detector consecutively with no effective edges of the first input clock signal presented between the two edges; and circuit means for making pulse widths of the first and second frequency difference pulse signals constant and then outputting the first and second frequency difference pulse signals with the constant widths.

2. A frequency detector comprising:

a three-state phase detector including first and second input terminals and first and second output terminals, wherein to detect a phase difference between first and second input clock signals presented to the first and second input terminals, respectively, the phase detector outputs first and second phase difference pulse signals through the first and second output terminals, respectively, by alternating among three states in such a manner that:

if an effective edge of the first input clock signal is presented to the phase detector in a neutral state, then the phase detector is set to change into a first phase detection state, if an effective edge of the second input clock signal is presented to the phase detector in the neutral state, then the phase detector is set to change into a second phase detection state and if effective edges of the first and second input clock signals are presented to the phase detector in this order or vice versa, then a reset signal is generated and the phase detector is reset and set back to the neutral state responsive to the reset signal;

a first latch, which latches the signal, output through the first output terminal, responsive to an effective edge of the first input clock signal, and which is reset responsive to the reset signal, the first latch outputting a first frequency difference pulse signal if two edges of the first input clock signal have been presented to the phase detector consecutively with no effective edges of the second input clock signal presented between the two edges;

a second latch, which latches the signal, output through the second output terminal, responsive to an effective edge of the second input clock signal, and which is reset responsive to the reset signal, the second latch outputting a second frequency difference pulse signal if two edges of the second input clock signal have been presented to the phase detector consecutively with no effective edges of the first input clock signal presented between the two edges;

a first counter, which starts counting the number of pulses of a third input clock signal responsive to the first frequency difference pulse signal and which is reset when the first counter counts a predetermined number; and a second counter, which starts counting the number of pulses of the third input clock signal responsive to the second frequency difference pulse signal and which is reset when the second counter counts another predetermined number.

3. A phase-locked loop circuit comprising:

a phase-locked loop; and a frequency controller for eliminating a frequency deviation from the phase-locked loop, wherein the frequency controller includes:

a frequency detector for receiving reference and oscillated clock signals for the phase-locked loop as the first and second input clock signals, respectively;

said frequency detector comprising:

a three-state phase detector including first and second input terminals and first and second output terminals, wherein to detect a phase difference between first and second input clock signals presented to the first and second input terminals, respectively, the phase detector outputs first and second phase difference pulse signals through the first and second output terminals, respectively, by alternating among three states in such a manner that:

if an effective edge of the first input clock signal is presented to the phase detector in a neutral state, then the phase detector is set to change into a first phase detection state, if an effective edge of the second input clock signal is presented to the phase detector in the neutral state, then the phase detector is set to change into a second phase detection state and if effective edges of the first and second input clock signals are presented to the phase detector in this order or vice versa, then a reset signal is generated and the phase detector is reset and set back to the neutral state responsive to the reset signal;

a first latch, which latches the signal, output through the first output terminal, responsive to an effective edge of the first input clock signal, and which is reset responsive to the reset signal, the first latch outputting a first frequency difference pulse signal if two edges of the first input clock signal have been presented to the phase detector consecutively with no effective edges of the second input clock signal presented between the two edges;

a second latch, which latches the signal, output through the second output terminal, responsive to an effective edge of the second input clock signal, and which is reset responsive to the reset signal, the second latch outputting a second frequency difference pulse signal if two edges of the second input clock signal have been presented to the phase detector consecutively with no effective edges of the first input clock signal presented between the two edges; and circuit means for making pulse widths of the first and second frequency difference pulse signals constant and then outputting the first and second frequency difference pulse signals with the constant widths;

said frequency controller further comprising a charge pump for controlling an oscillation frequency of the phase-locked loop responsive to the first and second frequency difference pulse signals that have been output from the frequency detector.

4. A phase-locked loop circuit comprising:

a phase-locked loop; and a frequency controller for eliminating a frequency deviation from the phase-locked loop, wherein the frequency controller includes:

a frequency detector for receiving reference and oscillated clock signals for the phase-locked loop as the first and second input clock signals, respectively;

said frequency detector comprising:

a three-state phase detector including first and second input terminals and first and second output terminals, wherein to detect a phase difference between first and second input clock signals presented to the first and second input terminals, respectively, the phase detector outputs first and second phase difference pulse signals through the first and second output terminals, respectively, by alternating among three states in such a manner that:

if an effective edge of the first input clock signal is presented to the phase detector in a neutral state, then the phase detector is set to change into a first phase detection state, if an effective edge of the second input clock signal is presented to the phase detector in the neutral state, then the phase detector is set to change into a second phase detection state and if effective edges of the first and second input clock signals are presented to the phase detector in this order or vice versa, then a reset signal is generated and the phase detector is reset and set back to the neutral state responsive to the reset signal;

a first latch, which latches the signal, output through the first output terminal, responsive to an effective edge of the first input clock signal, and which is reset responsive to the reset signal, the first latch outputting a first frequency difference pulse signal if two edges of the first input clock signal have been presented to the phase detector consecutively with no effective edges of the second input clock signal presented between the two edges;

a second latch, which latches the signal, output through the second output terminal, responsive to an effective edge of the second input clock signal, and which is reset responsive to the reset signal, the second latch outputting a second frequency difference pulse signal if two edges of the second input clock signal have been presented to the phase detector consecutively with no effective edges of the first input clock signal presented between the two edges;

a first counter, which starts counting the number of pulses of a third input clock signal responsive to the first frequency difference pulse signal and which is reset when the first counter counts a predetermined number; and a second counter, which starts counting the number of pulses of the third input clock signal responsive to the second frequency difference pulse signal and which is reset when the second counter counts another predetermined number;

said frequency controller further comprising an up/down counter for updating a count responsive to outputs of the first and second counters of the frequency detector; and a digital-to-analog converter for performing an analog control over an oscillation frequency of the phase-locked loop in accordance with the count of the up/down counter.

* * * * *